(12) United States Patent
Mebarki et al.

(10) Patent No.: US 9,847,252 B2
(45) Date of Patent: Dec. 19, 2017

(54) METHODS FOR FORMING 2-DIMENSIONAL SELF-ALIGNED VIAS

(71) Applicant: APPLIED MATERIALS, INC., Santa Clara, CA (US)

(72) Inventors: Bencherki Mebarki, Santa Clara, CA (US); Srinivas D. Nemani, Sunnyvale, CA (US); Mehul Naik, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/453,675

(22) Filed: Mar. 8, 2017

(65) Prior Publication Data
US 2017/0294348 A1 Oct. 12, 2017

Related U.S. Application Data

(60) Provisional application No. 62/321,698, filed on Apr. 12, 2016.

(51) Int. Cl.
*H01L 21/768* (2006.01)
*H01L 23/522* (2006.01)
*H01L 23/532* (2006.01)
*H01L 23/528* (2006.01)

(52) U.S. Cl.
CPC .... *H01L 21/76897* (2013.01); *H01L 21/7681* (2013.01); *H01L 23/528* (2013.01); *H01L 23/5226* (2013.01); *H01L 23/53209* (2013.01); *H01L 23/53228* (2013.01); *H01L 23/53257* (2013.01); *H01L 23/53295* (2013.01)

(58) Field of Classification Search
CPC ......... H01L 21/76808; H01L 21/76811; H01L 21/76831
See application file for complete search history.

(56) References Cited

U.S. PATENT DOCUMENTS

| 6,767,825 B1 * | 7/2004 | Wu .................. H01L 21/31116 257/E21.252 |
| 8,404,582 B2 | 3/2013 | Horak et al. |
| 2007/0077761 A1 | 4/2007 | Lehr et al. |

OTHER PUBLICATIONS

Abstract for Invited Paper for MAR15 Meeting of the American Physical Society, "Novel Patterning Approaches for Continued Device Scaling", Florian Gstrein, downloaded on Aug. 4, 2017, http://meetings.aps.org/link/BAPS.2015.Mar.M19.4.

* cited by examiner

*Primary Examiner* — Mohammad Choudhry
(74) *Attorney, Agent, or Firm* — Moser Taboada; Alan Taboada

(57) ABSTRACT

A method of processing a substrate includes: depositing an etch stop layer atop a first dielectric layer; forming a feature in the etch stop layer and the first dielectric layer; depositing a first metal layer to fill the feature; etching the first metal layer to form a recess; depositing a second dielectric layer to fill the recess wherein the second dielectric layer is a low-k material suitable as a metal and oxygen diffusion barrier; forming a patterned mask layer atop the substrate to expose a portion of the second dielectric layer and the etch stop layer; etching the exposed portion of the second dielectric layer to a top surface of the first metal layer to form a via in the second dielectric layer; and depositing a second metal layer atop the substrate, wherein the second metal layer is connected to the first metal layer by the via.

20 Claims, 4 Drawing Sheets

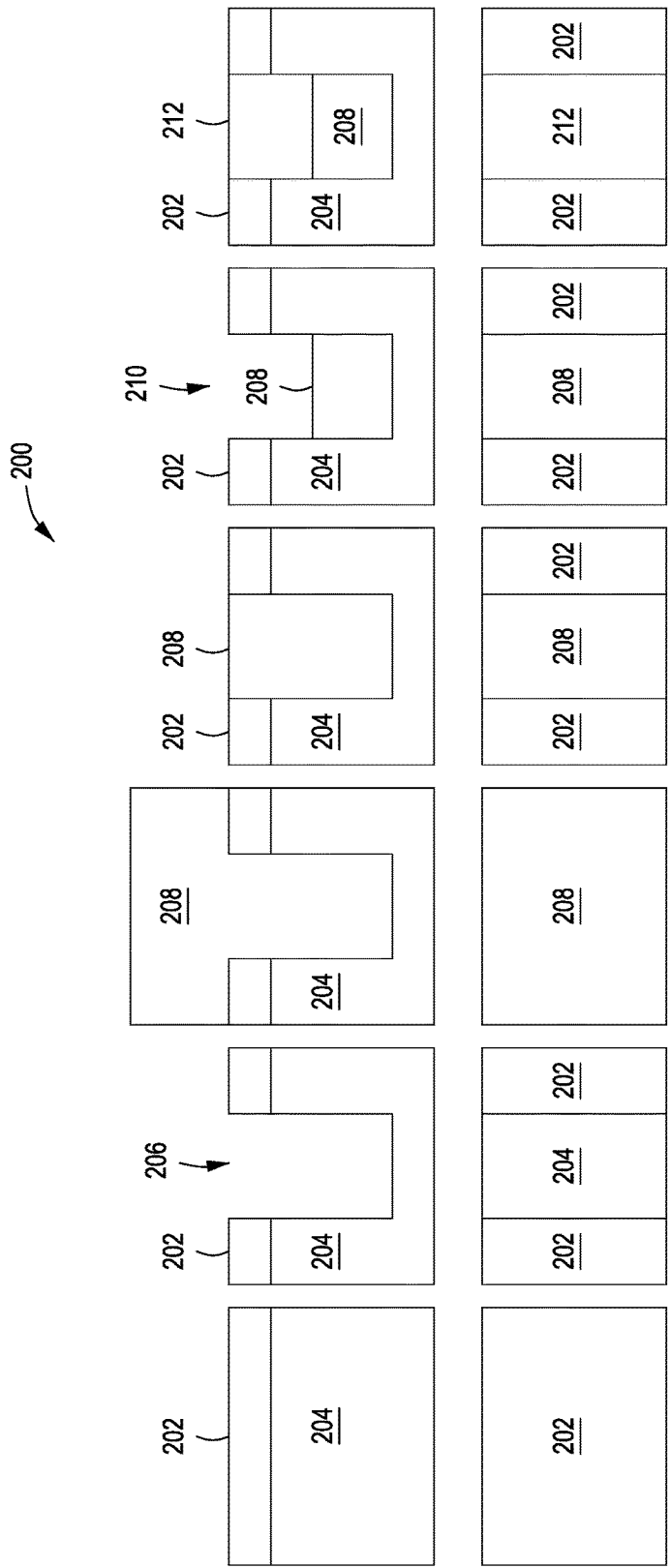

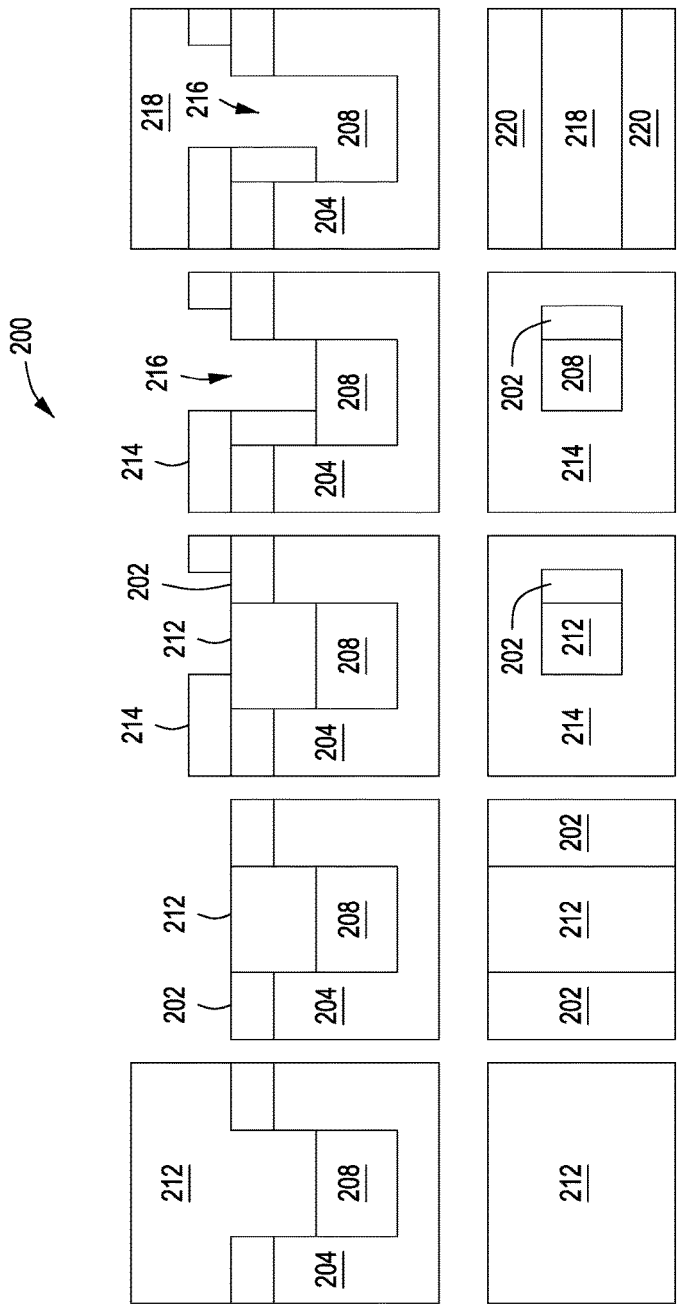

METHODS FOR FORMING 2-DIMENSIONAL SELF-ALIGNED VIAS

CROSS-REFERENCE TO RELATED APPLICATIONS

This application claims benefit of U.S. provisional patent application Ser. No. 62/321,698, filed Apr. 12, 2016, which is herein incorporated by reference in its entirety.

FIELD

Embodiments of the present disclosure generally relate to methods of processing substrates. Specifically, embodiments of the present disclosure relate to method for forming 2-dimensional self-aligned vias for advanced interconnects.

BACKGROUND

Damascene techniques generally involve depositing an interlevel dielectric (ILD) layer, forming an opening in the ILD, overfilling the opening with a metal such as copper (Cu), and removing excess metal using chemical mechanical polishing (CMP). Multiple ILD layers are typically used which results in an overall interconnect structure having many wiring levels. The openings typically resemble a trench running essentially parallel to the surface of the substrate, and a filled trench is referred to as a "wire" or a "line". These are used to route signals from one location on an integrated circuit (IC) to another location. The openings forming the trench (for the wire) may extend only partially into the thickness of the ILD from the top surface. In dual damascene techniques, an opening in the ILD includes both a lower via (to contact the line beneath) in communication with an upper trench (and further may include other trenches without associated vias). Proper alignment of the via to the lower metal line is necessary for proper operation of the integrated circuit.

Accordingly, the inventors have developed improved techniques for forming 2-dimensional self-aligned vias for advanced interconnects.

SUMMARY

Embodiments of methods for forming 2-dimensional self-aligned vias for advanced interconnects are provided herein. In some embodiments, a method of processing a substrate having a first dielectric layer includes: (a) depositing an etch stop layer atop the first dielectric layer; (b) forming a feature in the etch stop layer and the first dielectric layer; (c) depositing a first metal layer to fill the feature; (d) etching the first metal layer to form a recess within the first metal layer; (e) depositing a second dielectric layer to fill the recess wherein the second dielectric layer is a low-k material suitable as a metal diffusion barrier and oxygen diffusion barrier; (f) forming a patterned mask layer atop the substrate, wherein the patterned mask layer exposes a portion of the second dielectric layer and the etch stop layer; (g) etching the exposed portion of the second dielectric layer to a top surface of the first metal layer to form a via in the second dielectric layer; and (h) depositing a second metal layer atop the substrate, wherein the second metal layer is connected to the first metal layer by the via.

In some embodiments, a method of processing a substrate having a first dielectric layer includes: (a) depositing an etch stop layer atop the first dielectric layer; (b) forming a feature in the etch stop layer and the first dielectric layer; (c) depositing a first metal layer to fill the feature, wherein the first metal layer is copper, cobalt, or tungsten; (d) etching the first metal layer to form a recess within the first metal layer, wherein the recess has a depth that is substantially equal to about 110 to about 150 percent of a depth of the etch stop layer, and wherein the recess has a width that is substantially equal to a width of the feature; (e) depositing a second dielectric layer to fill the recess wherein the second dielectric layer is a low-k material suitable as a metal diffusion barrier and an oxygen diffusion barrier; (f) forming a patterned mask layer atop the substrate, wherein the patterned mask layer exposes a portion of the second dielectric layer and the etch stop layer; (g) etching the exposed portion of the second dielectric layer to a top surface of the first metal layer to form a via in the second dielectric layer; and (h) depositing a second metal layer atop the substrate, wherein the second metal layer is connected to the first metal layer by the via, and wherein the second metal layer is copper, cobalt, or tungsten.

In some embodiments, a non-transitory computer readable medium having instructions stored thereon that, when executed, cause a method for processing a substrate having a first dielectric layer to be performed. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIGS. 2A-2K schematically depict sequential side and top views of the stages of forming 2-dimensional self-aligned vias for advanced interconnects in accordance with some embodiments of the present disclosure.

Figure 1:
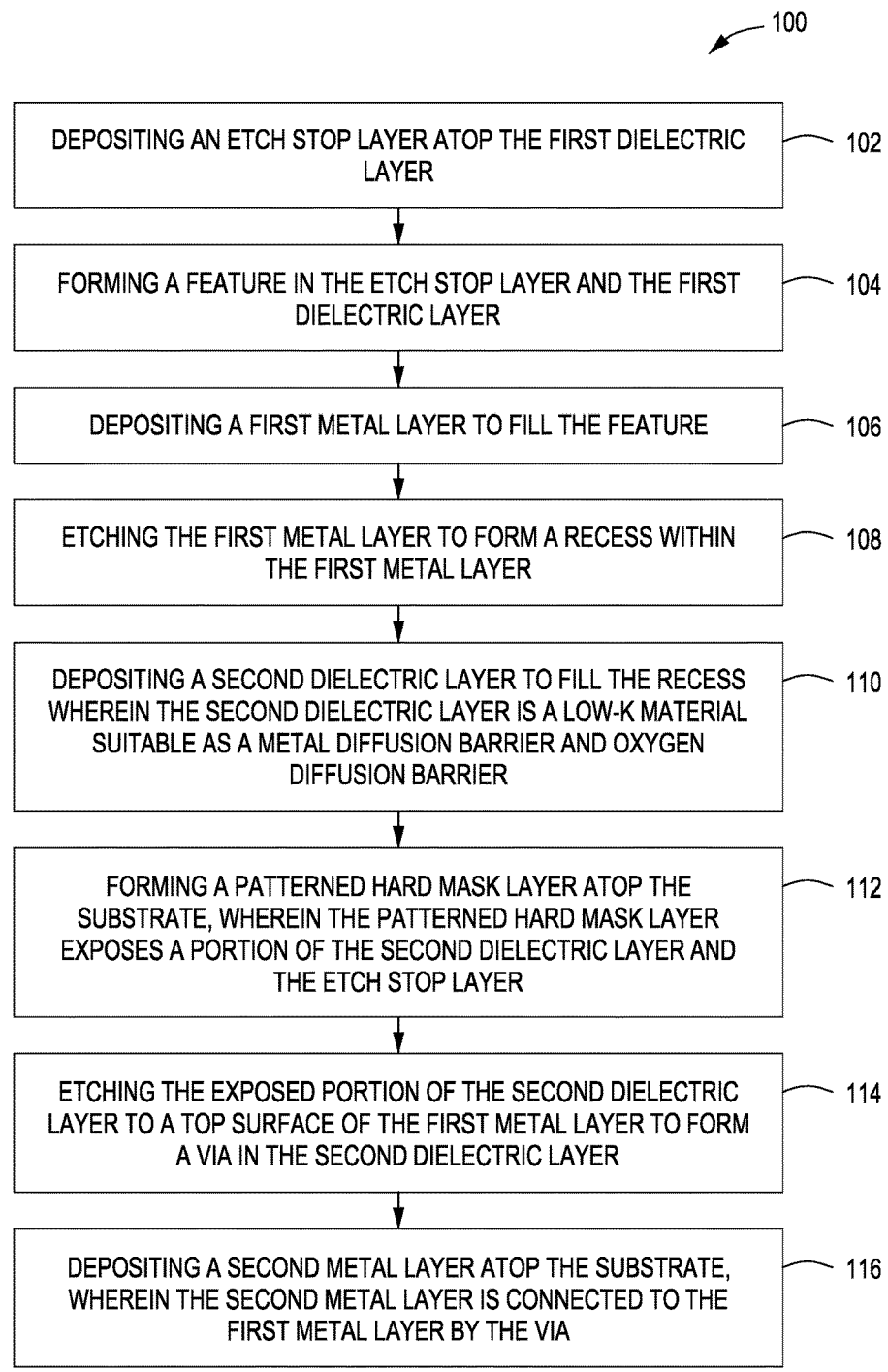
FIG. 1 depicts a flow chart of a method for forming 2-dimensional self-aligned vias for advanced interconnects in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods for forming 2-dimensional self-aligned vias for advanced interconnects are provided herein. The inventive methods described herein may be utilized in the formation of metal interconnects in an integrated circuit, or in the formation of a metal gate or a metal-contact gap fill process, as well as other suitable applications utilizing filling a feature with a conductive material.

FIG. 1 depicts a flow chart of a method 100 for forming 2-dimensional self-aligned vias for advanced interconnects in accordance with some embodiments of the present disclosure. The method 100 is described below with respect to an interconnect structure, as depicted in FIGS. 2A-2K. Each of FIGS. 2A-2K include a schematic side view (upper figure) and a top view (lower figure) for the particular stage of fabrication. The method 100 may be performed in any suitable process chambers configured for one or more of chemical vapor deposition (CVD), physical vapor deposition (PVD), or atomic layer deposition (ALD). Exemplary processing systems that may be used to perform the inventive methods disclosed herein may include, but are not limited to, any of the ENDURA®, CENTURA®, or PRODUCER® line of processing systems, commercially available from Applied Materials, Inc., of Santa Clara, Calif. Other process chambers, including ones available from other manufacturers, may also be suitably used in connection with the teachings provided herein.

The method 100 is performed on a substrate, such as the substrate 200 depicted in FIG. 2A. In some embodiments, the substrate 200 is composed of a material used in a semiconductor manufacturing process. For example, the substrate 200 may comprise one or more of silicon (Si), germanium, silicon germanium, doped or undoped polysilicon, doped or undoped silicon wafers and patterned or non-patterned wafers silicon on insulator (SOI), doped silicon, or the like. The substrate 200 may have various dimensions, such as 200 mm, 300 mm or 450 mm diameter wafers or other dimensions. In some embodiments, the substrate 200 comprises at least one of silicon or germanium. In addition, the substrate 200 may include additional layers of materials or may have one or more completed or partially completed structures or devices formed in or on the substrate 200. For example, the substrate 200 may have a first dielectric layer 204 formed atop the substrate 200. In some embodiments, first dielectric layer 204 may be a low-k dielectric material (e.g., a material having a dielectric constant less than silicon oxide, or less than about 3.9). Examples of suitable dielectric materials include silicon dioxide ($SiO_2$), fluorine-doped silicon dioxide, carbon-doped silicon dioxide, porous silicon dioxide, porous carbon-doped silicon dioxide, a spin-on organic polymeric dielectric, or a spin-on silicon based polymeric dielectric. The first dielectric layer 204 may be deposited by using any suitable deposition method used in semiconductor manufacturing processes, such as physical vapor deposition, chemical vapor deposition, atomic vapor deposition or the like. The first dielectric layer 204 may be deposited to a thickness of, for example, about 100 to about 2,000 angstroms. The thickness of the first dielectric layer 204 can vary depending upon factors such as the technology node, the architecture design, the process flow scheme, or the like.

The method generally begins at 102, and as depicted in FIG. 2A, by depositing an etch stop layer 202 directly atop the first dielectric layer 204. In some embodiments, the etch stop layer 202 is aluminum nitride, aluminum oxide, aluminum oxynitride, boron nitride, titanium nitride, titanium oxide, tantalum oxide, tantalum nitride, tungsten oxide, or tungsten nitride. The etch stop layer 202 may be deposited by using any suitable deposition method used in semiconductor manufacturing processes, such as physical vapor deposition, chemical vapor deposition, atomic vapor deposition or the like. The etch stop layer is blanket deposited (i.e. deposited atop the entire exposed surface of the first dielectric layer 204 to advantageously reduce or eliminate roughness at the interface of the etch stop layer 202 and the first dielectric layer 204. The etch stop layer 202 may be deposited to a thickness of, for example, about 10 to about 100 angstroms. The thickness of the etch stop layer 202 can vary depending upon factors such as the technology node, the architecture design, the process flow scheme, or the like.

Next at 104, and as depicted in FIG. 2B, a feature 206 is formed in the etch stop layer 202 and the first dielectric layer 204. In some embodiments, the feature 206 is formed by using any suitable etch process used in semiconductor manufacturing processes. In some embodiments, the feature 206 may be a trench or a via. In some embodiments, the feature 206 may have a depth of about 100 to about 2,000 angstroms. In some embodiments, the feature 206 may have a width of about 50 to about 300 angstroms. In some embodiments, the feature 206 may have an aspect ratio (of width to depth) of about 1:2 to about 3:1. Any or all of the depth, width, and/or aspect ratio of the feature 206 can vary depending upon factors such as the technology node, the architecture design, the process flow scheme, or the like.

The feature 206 may be etched via any etching process suitable for etching a dielectric material to form a feature 206 having vertical or substantially vertical sidewalls. For example, the substrate 200 may be exposed to an etching plasma formed using a halogen containing gas, for example a fluorine-containing gas such as carbon tetrafluoride ($CF_4$), methyl trifluoride ($CHF_3$), octafluorocyclobutane ($C_4F_8$), hexafluorobutadiene ($C_4F_6$), nitrogen trifluoride ($NF_3$), sulfur hexafluoride ($SF_6$), or the like.

Next at 106, and as depicted in FIG. 2C, a first metal layer 208 is deposited atop the substrate 200 to fill the feature 206. In some embodiments, the first metal layer 208 can be any suitable metal material used in forming interconnects in a semiconductor manufacturing process, for example copper, or cobalt, or tungsten. In some embodiments, the first metal layer 208 is also deposited above the top surface of the etch stop layer 202. Accordingly, as depicted in FIG. 2D, the first metal layer 208 is etched, for example, by chemical mechanical polishing (CMP) to remove the excess metal deposition from the top surface of the etch stop layer 202.

Next at 108, and as depicted in FIG. 2E, the first metal layer 208 is etched to form a recess 210 within the first metal layer 208. In some embodiments, the recess 210 may have a depth that is substantially equal to about 110 to about 150 percent of the depth of the etch stop layer 202 (e.g., a depth of about 11 to about 150 angstroms). In some embodiments, the recess 210 may have a width that is substantially equal to the width of the feature 206 (e.g., of about 50 to about 300 angstroms). The recess 210 is etched using any suitable etch process used in semiconductor manufacturing processing.

Next, at 110, a second dielectric layer 212 is deposited to fill the recess 210. The second dielectric layer 212 is a low-k material suitable as a metal diffusion barrier and oxygen diffusion barrier (e.g., a material having a dielectric constant less than silicon oxide, or less than about 3.9). Examples of suitable materials for the second dielectric layer 212 include, for example, silicon dioxide ($SiO_2$), silicon nitride (SiN), carbon-doped silicon nitride (SiCN), or carbon and oxygen doped silicon nitride (SiCON).

In some embodiments, as depicted in FIG. 2F, the second dielectric layer 212 is selectively deposited atop only the first metal layer 208 to fill the recess 210 to a top surface of the etch stop layer 202. In some embodiments, the second dielectric layer 212 can be selectively deposited by exposing the substrate to a treatment process configured to modify the exposed surface of the etch stop layer 202 to inhibit or delay the formation of the second dielectric layer 212. In some embodiments, the second dielectric layer 212 can be selectively deposited by utilizing precursors predisposed to deposit atop the exposed surface of the first metal layer 208. The second dielectric layer 212 can be deposited by any process suitable to provide the second dielectric layer 212 at a suitable thickness. For example, in some embodiments, the second dielectric layer 212 may be formed via a deposition process, such as chemical vapor deposition (CVD), physical vapor deposition (PVD), or a cyclical deposition process, for example, such as atomic layer deposition (ALD), or the like. The recess 210 advantageously serves as a guide for the selective deposition of the second dielectric layer 212.

In some embodiments, as depicted in FIG. 2G, the second dielectric layer 212 is blanket deposited atop the first metal layer 208 and the etch stop layer 202 to fill the recess 210. In some embodiments, the second dielectric layer 212 is deposited by an FCVD (flowable chemical vapor deposition) process, which refers to a method that makes use of a chemical vapor deposition (CVD) or atomic layer deposition (ALD) technique to fill features from the bottom toward the top. The apparatus and the materials necessary to carry out FCVD are commercially available from Applied Materials, Inc. of Santa Clara Calif.

In embodiments as depicted in FIG. 2G, the second dielectric layer 212 is also deposited above the top surface of the etch stop layer 202. Accordingly, as depicted in FIG. 2H, the second dielectric layer 212 is etched, for example, by chemical mechanical polishing (CMP) to remove the excess second dielectric layer 212 material from the top surface of the etch stop layer 202.

Next at 112, and as depicted in FIG. 2I, a patterned mask layer 214 is formed atop the substrate 200, wherein the patterned mask layer 214 exposes a portion of the second dielectric layer 212 and the etch stop layer 202. The patterned mask layer 214 may be any suitable mask layer such as a hard mask or photoresist layer. The patterned mask layer 214 may be formed by any process suitable to form a patterned mask layer capable of providing an adequate template for defining a pattern in the underlying layer. For example, in some embodiments, the patterned mask layer 214 may be formed via a patterned etch process.

Next at 114, and as depicted in FIG. 2J, the exposed portion of the second dielectric layer 212 is etched to a top surface of the first metal layer 208 to form a via 216 in the second dielectric layer 212. In some embodiments, the via 216 is formed by using any suitable etch process used in semiconductor manufacturing processes. The via 216 may be etched via any etching process suitable for etching a dielectric material to form a via 216 having vertical or substantially vertical sidewalls. For example, the substrate 200 may be exposed to an etching plasma formed using a halogen containing gas, for example a fluorine-containing gas such as carbon tetrafluoride ($CF_4$), methyl trifluoride ($CHF_3$), octafluorocyclobutane ($C_4F_8$), hexafluorobutadiene ($C_4F_6$), nitrogen trifluoride ($NF_3$), sulfur hexafluoride ($SF_6$), or the like.

Next at 116, and as depicted in FIG. 2K, a second metal layer 218 is deposited atop the substrate 200, wherein the second metal layer 218 is connected to the first metal layer 208 by the via 216. The second metal layer 218 may be deposited as a line, for example, within a patterned mask 220, as shown in the top view of FIG. 2k. In some embodiments, the second metal layer 218 can be any suitable metal material used in forming interconnects in a semiconductor manufacturing process, for example copper, or cobalt, or tungsten. In some embodiments, the second metal layer 218 is the same as the first metal layer 208.

Figure 3:
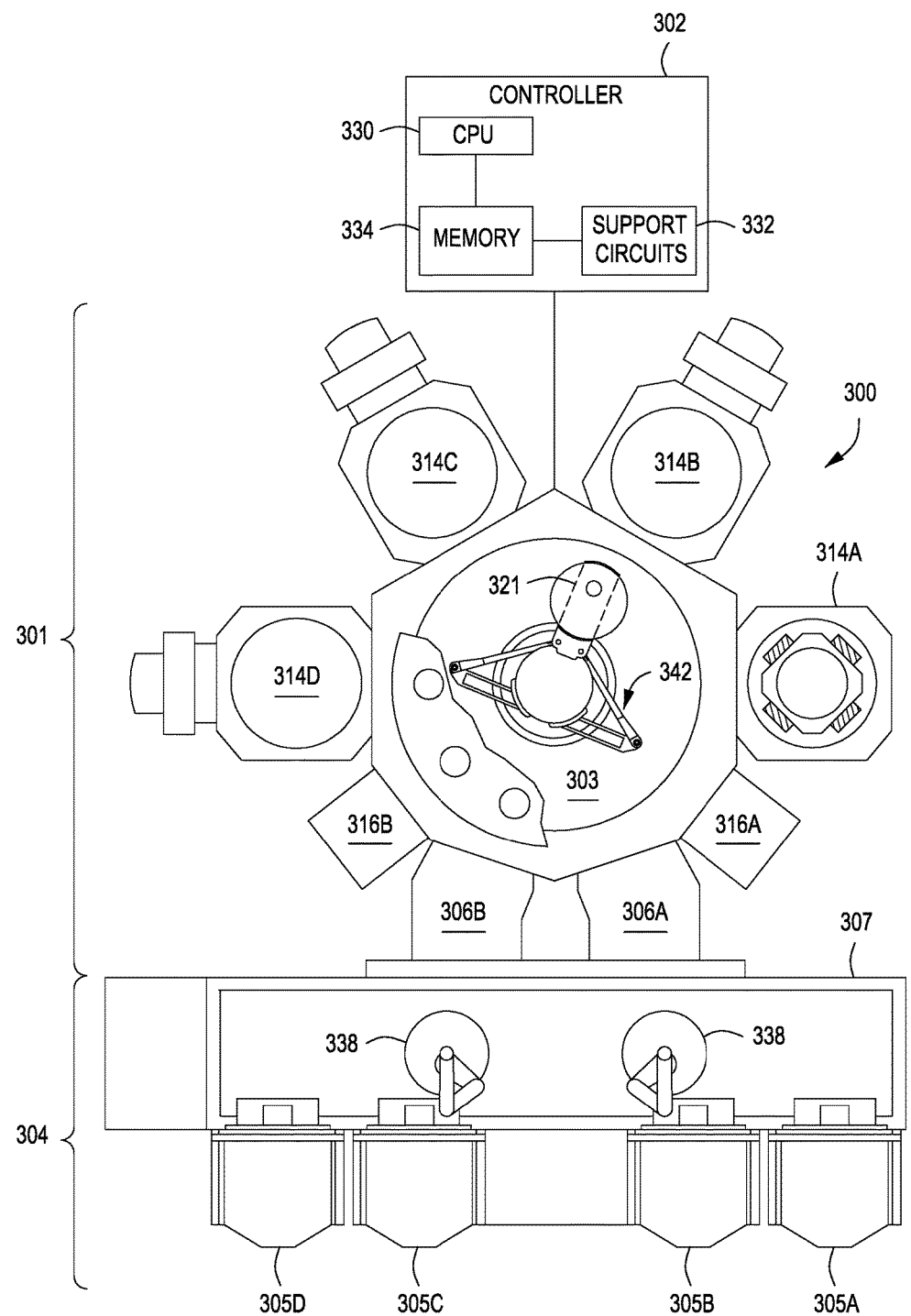
FIG. 3 depicts a cluster tool suitable to perform methods for processing a substrate in accordance with some embodiments of the present disclosure.

The method described herein may be performed in individual process chambers that may be provided in a stand-alone configuration or as part of a cluster tool, for example, an integrated tool 300 (i.e., cluster tool) described below with respect to FIG. 3. Examples of the integrated tool 300 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks between processing steps. For example, reduced vacuum breaks may limit or prevent contamination of the seed layer or other portions of the substrate.

The integrated tool 300 includes a vacuum-tight processing platform 301, a factory interface 304, and a system controller 302. The processing platform 301 comprises multiple process chambers, such as 314A, 314B, 314C, and 314D operatively coupled to a vacuum substrate transfer chamber (transfer chamber 303). The factory interface 304 is operatively coupled to the transfer chamber 303 by one or more load lock chambers (two load lock chambers, such as 306A and 306B shown in FIG. 4).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 4. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303. The load lock chamber 306A and 306B are coupled to a pressure control system (not shown) which pumps down and vents the load lock chambers 306A and 306B to facilitate passing the substrates between the vacuum environment of the transfer chamber 303 and the substantially ambient (e.g., atmospheric) environment of the factory interface 304. The transfer chamber 303 has a vacuum robot 342 disposed in the transfer chamber 303. The vacuum robot 342 is capable of transferring substrates 321 between the load lock chamber 306A and 306B and the process chambers 314A, 314B, 314C, and 314D.

In some embodiments, the process chambers 314A, 314B, 314C, and 314D, are coupled to the transfer chamber 303. The process chambers 314A, 314B, 314C, and 314D comprise at least a physical vapor deposition (PVD) chamber and a chemical vapor deposition (CVD) chamber. Additional chambers may also be provided such as additional CVD chambers, PVD chambers, annealing chambers, or the like. CVD and PVD chambers may include any chambers suitable to perform all or portions of the methods described herein, as discussed above.

In some embodiments, one or more optional service chambers (shown as 316A and 316B) may be coupled to the transfer chamber 303. The service chambers 316A and 316B may be configured to perform other substrate processes, such as degassing, orientation, substrate metrology, cool down and the like.

The system controller 302 controls the operation of the tool 300 using a direct control of the process chambers 314A, 314B, 314C, and 314D or alternatively, by controlling the computers (or controllers) associated with the process chambers 314A, 314B, 314C, and 314D and the tool 300. In operation, the system controller 302 enables data collection and feedback from the respective chambers and systems to optimize performance of the tool 300. The system controller 302 generally includes a central processing unit (CPU) 330, a memory 334, and a support circuit 332. The CPU 330 may be any form of a general purpose computer processor that can be used in an industrial setting. The support circuit 332 is conventionally coupled to the CPU 330 and may comprise a cache, clock circuits, input/output subsystems, power supplies, and the like. Software routines, such as methods as described above may be stored in the memory 334 and, when executed by the CPU 330, transform the CPU 330 into a specific purpose computer (system controller 302). The software routines may also be stored and/or executed by a second controller (not shown) that is located remotely from the tool 300.

While the foregoing is directed to embodiments of the present disclosure, other and further embodiments of the disclosure may be devised without departing from the basic scope thereof.

The invention claimed is:

1. A method of processing a substrate having a first dielectric layer, comprising:
   (a) depositing an etch stop layer atop the first dielectric layer;
   (b) forming a feature in the etch stop layer and the first dielectric layer;
   (c) depositing a first metal layer to fill the feature;
   (d) etching the first metal layer to form a recess within the first metal layer;
   (e) depositing a second dielectric layer to fill the recess wherein the second dielectric layer is a low-k material suitable as a metal diffusion barrier and an oxygen diffusion barrier;
   (f) forming a patterned mask layer atop the substrate, wherein the patterned mask layer exposes a portion of the second dielectric layer and the etch stop layer;
   (g) etching the exposed portion of the second dielectric layer to a top surface of the first metal layer to form a via in the second dielectric layer; and
   (h) depositing a second metal layer atop the substrate, wherein the second metal layer is connected to the first metal layer by the via.

2. The method of claim 1, wherein the etch stop layer is aluminum nitride, aluminum oxide, aluminum oxynitride, boron nitride, titanium nitride, titanium oxide, tantalum oxide, tantalum nitride, tungsten oxide, or tungsten nitride.

3. The method of claim 1, wherein the first dielectric layer is silicon dioxide, fluorine-doped silicon dioxide, carbon-doped silicon dioxide, porous silicon dioxide, porous carbon-doped silicon dioxide, a spin-on organic polymeric dielectric, or a spin-on silicon based polymeric dielectric.

4. The method of claim 1, wherein the first metal layer is copper, cobalt, or tungsten.

5. The method of claim 1, wherein the second dielectric layer is selectively deposited atop only the first metal layer to fill the recess to a top surface of the etch stop layer.

6. The method of claim 1, wherein the second dielectric layer is blanket deposited atop the first metal layer and the etch stop layer to fill the recess.

7. The method of claim 6, wherein the second dielectric layer is etched to a top surface of the etch stop layer.

8. The method of claim 1, wherein the second dielectric layer is silicon dioxide, silicon nitride, carbon-doped silicon nitride, or carbon and oxygen doped silicon nitride.

9. The method of claim 1, wherein the second metal layer is copper, cobalt, or tungsten.

10. The method of claim 1, wherein the recess has a depth that is substantially equal to about 110 to about 150 percent of a depth of the etch stop layer.

11. The method of claim 1, wherein the recess has a width that is substantially equal to a width of the feature.

12. A method of processing a substrate having a first dielectric layer, comprising:
   (a) depositing an etch stop layer atop the first dielectric layer;
   (b) forming a feature in the etch stop layer and the first dielectric layer;
   (c) depositing a first metal layer to fill the feature, wherein the first metal layer is copper, cobalt, or tungsten;
   (d) etching the first metal layer to form a recess within the first metal layer, wherein the recess has a depth that is substantially equal to about 110 to about 150 percent of a depth of the etch stop layer, and wherein the recess has a width that is substantially equal to a width of the feature;
   (e) depositing a second dielectric layer to fill the recess wherein the second dielectric layer is a low-k material suitable as a metal diffusion barrier and an oxygen diffusion barrier;
   (f) forming a patterned mask layer atop the substrate, wherein the patterned mask layer exposes a portion of the second dielectric layer and the etch stop layer;
   (g) etching the exposed portion of the second dielectric layer to a top surface of the first metal layer to form a via in the second dielectric layer; and
   (h) depositing a second metal layer atop the substrate, wherein the second metal layer is connected to the first metal layer by the via, and wherein the second metal layer is copper, cobalt, or tungsten.

13. A non-transitory computer readable medium having instructions stored thereon that, when executed, cause a method for processing a substrate having a first dielectric layer to be performed, the method comprising:
   (a) depositing an etch stop layer atop the first dielectric layer;
   (b) forming a feature in the etch stop layer and the first dielectric layer;
   (c) depositing a first metal layer to fill the feature;
   (d) etching the first metal layer to form a recess within the first metal layer;
   (e) depositing a second dielectric layer to fill the recess wherein the second dielectric layer is a low-k material suitable as a metal diffusion barrier and oxygen diffusion barrier;
   (f) forming a patterned mask layer atop the substrate, wherein the patterned mask layer exposes a portion of the second dielectric layer and the etch stop layer;
   (g) etching the exposed portion of the second dielectric layer to a top surface of the first metal layer to form a via in the second dielectric layer; and
   (h) depositing a second metal layer atop the substrate, wherein the second metal layer is connected to the first metal layer by the via.

14. The non-transitory computer readable of claim 13, wherein the etch stop layer is aluminum nitride, aluminum oxide, aluminum oxynitride, boron nitride, titanium nitride, titanium oxide, tantalum oxide, tantalum nitride, tungsten oxide, or tungsten nitride.

15. The non-transitory computer readable of claim 13, wherein the first dielectric layer is silicon dioxide, fluorine-doped silicon dioxide, carbon-doped silicon dioxide, porous silicon dioxide, porous carbon-doped silicon dioxide, a spin-on organic polymeric dielectric, or a spin-on silicon based polymeric dielectric.

16. The non-transitory computer readable of claim 13, wherein the first metal layer is copper, cobalt, or tungsten.

17. The non-transitory computer readable of claim 13, wherein the second dielectric layer is selectively deposited atop only the first metal layer to fill the recess to a top surface of the etch stop layer.

18. The non-transitory computer readable of claim 13, wherein the second dielectric layer is blanket deposited atop the first metal layer and the etch stop layer to fill the recess.

19. The non-transitory computer readable of claim 18, wherein the second dielectric layer is etched to a top surface of the etch stop layer.

20. The non-transitory computer readable of claim 13, wherein the second metal layer is copper, cobalt, or tungsten.

* * * * *